United States Patent
Kim

(10) Patent No.: US 10,318,186 B2
(45) Date of Patent: Jun. 11, 2019

(54) SEMICONDUCTOR DEVICE AND SEMICONDUCTOR SYSTEM WITH WORD LINE COPY

(71) Applicant: SK hynix Inc., Icheon-si, Gyeonggi-do (KR)

(72) Inventor: Hee Seong Kim, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 329 days.

(21) Appl. No.: 15/229,487

(22) Filed: Aug. 5, 2016

(65) Prior Publication Data

US 2017/0329540 A1  Nov. 16, 2017

(30) Foreign Application Priority Data

May 12, 2016  (KR) .................. 10-2016-0058436

(51) Int. Cl.
| | | |
|---|---|---|
| G06F 3/06 | (2006.01) | |
| G11C 11/406 | (2006.01) | |
| G11C 11/4076 | (2006.01) | |
| G11C 11/4091 | (2006.01) | |
| G11C 29/52 | (2006.01) | |
| G11C 29/50 | (2006.01) | |

(52) U.S. Cl.
CPC ............ *G06F 3/0619* (2013.01); *G06F 3/065* (2013.01); *G06F 3/0673* (2013.01); *G11C 11/406* (2013.01); *G11C 11/4076* (2013.01); *G11C 11/4091* (2013.01); *G11C 29/50016* (2013.01); *G11C 29/52* (2013.01); *G11C 2207/2236* (2013.01)

(58) Field of Classification Search
None
See application file for complete search history.

(56) References Cited

U.S. PATENT DOCUMENTS

| | | | |
|---|---|---|---|
| 8,072,827 B2 | 12/2011 | Wakimoto | |
| 9,117,544 B2* | 8/2015 | Bains ................ | G11C 11/40615 |
| 2017/0287547 A1* | 10/2017 | Ito ....................... | G11C 11/4087 |
| 2018/0190362 A1* | 7/2018 | Barndt ............... | G11C 16/3431 |

FOREIGN PATENT DOCUMENTS

KR  1020140080295 A  6/2014

* cited by examiner

*Primary Examiner* — Harry W Byrne
*Assistant Examiner* — R Lance Reidlinger
(74) *Attorney, Agent, or Firm* — William Park & Associates Ltd.

(57) ABSTRACT

A semiconductor device including an operation control signal generation circuit configured for generating an operation control signal for a target word line. The semiconductor device including a copy operation circuit configured for performing a first copy operation of storing data of first cells coupled to an adjacent word line adjacent to the target word line, in second cells coupled to a first clone word line, based on the operation control signal.

20 Claims, 11 Drawing Sheets

SEMICONDUCTOR DEVICE AND SEMICONDUCTOR SYSTEM WITH WORD LINE COPY

CROSS-REFERENCE TO RELATED APPLICATION

The present application claims priority under 35 U.S.C. § 119(a) to Korean Patent Application No. 10-2016-0058436 filed on May 12, 2016 in the Korean Intellectual Property Office, which is incorporated herein by reference in its entirety.

BACKGROUND

1. Technical Field

Embodiments of the present disclosure may generally relate to a semiconductor device, semiconductor system, and method related to performing a refresh operation.

2. Related Art

A semiconductor device includes a plurality of cell arrays for storing data. Each of the plurality of cell arrays includes a plurality of cells. Each cell is constructed by a cell capacitor and a cell transistor. The semiconductor device stores data through an operation of charging or discharging electric charges to or from the cell capacitor. Ideally, the amount of electric charges stored in the cell capacitor should be always constant. However, the amount of electric charges stored in the cell capacitor, actually, varies due to a voltage difference with respect to a peripheral circuit. Electric charges may leak in the state in which the cell capacitor is charged, or electric charges may be introduced in the state in which the cell capacitor is discharged. The variation in the amount of electric charges in the cell capacitor means that data stored in the cell capacitor is changed, that is, loss of stored data. A semiconductor device performs a refresh operation to prevent a phenomenon whereby data is lost as described above.

As processing technologies are developed, the degree of integration of a semiconductor device is gradually increased. An increase in the degree of integration of a semiconductor device exerts an influence on the size of a bank. The fact that the size of a bank is gradually decreased means that the interval between cells decreases, which means that the interval between word lines respectively coupled to adjacent cells decreases. While a particular problem has not occurred so far in relation with the interval between word lines, new issues which have not been previously considered to be problematic are caused recently as the interval between word lines decreases. One of the issues is an interference effect that occurs between adjacent word lines. If an interference effect occurs between adjacent word lines, the cells coupled to the corresponding word lines may be difficult to retain data stored therein. That is, the probability of losing data increases.

Recently, in a semiconductor device, in order to prevent data from being lost, a refresh operation is performed for all the cells of a bank, or an additional refresh operation is performed for adjacent word lines adjacent to a target word line which is accessed concentratedly.

SUMMARY

In an embodiment, a semiconductor device may be provided. In an embodiment, a semiconductor system may be provided. In an embodiment, a method relating to a refresh operation may be provided. The semiconductor device may include an operation control signal generation circuit configured for generating an operation control signal for a target word line. The semiconductor device may include a copy operation circuit configured for performing a first copy operation of storing data of first cells coupled to an adjacent word line adjacent to the target word line, in second cells coupled to a first clone word line, based on the operation control signal.

In an embodiment, a semiconductor device may include: an operation control signal generation circuit suitable for generating an operation control signal for a target word line which is accessed, based on an access information; and a copy operation circuit suitable for performing a copy operation of storing data of first cells coupled to the target word line, in second cells coupled to a clone word line, in response to the operation control signal.

In an embodiment, a semiconductor system may include: a first semiconductor device suitable for outputting a command and an address; and a second semiconductor device suitable for performing a first copy operation for a target word line which is driven in response to the address, in a state in which a refresh is performed in response to the command, the second semiconductor device generating an operation control signal for the target word line which is accessed, based on an access information, and performing the first copy operation of storing data of first cells coupled to an adjacent word line adjacent to the target word line, in second cells coupled to a first clone word line, in response to the operation control signal.

In an embodiment, a method of performing a refresh operation of a semiconductor device comprises generating an operation control signal for a target word line which is accessed, based on access information. The method of performing a refresh operation of a semiconductor device comprises determining whether a copy operation has already been performed for the target word line. The method of performing a refresh operation of a semiconductor device comprises performing a first copy operation of storing data of first cells coupled to an adjacent word line adjacent to the target word line, in second cells coupled to a first clone word line based on the operation control signal and the determination of whether the copy operation has already been performed for the target word line. The method of performing a refresh operation of a semiconductor device comprises performing a refresh operation for the target word line if it is determined that the copy operation has already been performed for the target word line. The method of performing a refresh operation of a semiconductor device comprises generating an operation control signal for a next target word line which is accessed, based on access information for the next target word line.

According to the embodiments, if the copy operation has not already been performed for the target word line, then performing the first copy operation of storing the data of the first cells coupled to the adjacent word line adjacent to the target word line, in the second cells coupled to the first clone word line based on the operation control signal.

DETAILED DESCRIPTION

Various embodiments may be directed to a semiconductor device capable of improving efficiency of a refresh operation and a semiconductor system.

According to some embodiments, by storing data of cells coupled to adjacent word lines adjacent to a target word line which is accessed concentratedly, in cells coupled to clone word lines, it may be possible to prevent the data of the adjacent word lines from being lost.

According to some embodiments, since an additional refresh operation is not performed for the adjacent word lines adjacent to the target word line which is accessed concentratedly, a refresh operation count may be decreased to a minimum, whereby the performance of a semiconductor device may be improved and consumption of refresh power may be reduced.

Moreover, according to the embodiments, after performing a copy operation of storing the data of the cells coupled to the adjacent word lines adjacent to the target word line which is accessed concentratedly, in the cells coupled to the clone word lines, in the case where the target word line is accessed again, a refresh operation for only the target word line is performed, a copy operation is not performed iteratively, and refresh operations for the adjacent word lines are not performed, whereby power consumption may be reduced.

Hereinafter, a semiconductor device and a semiconductor system will be described below with reference to the accompanying drawings through various examples of embodiments.

Figure 1:
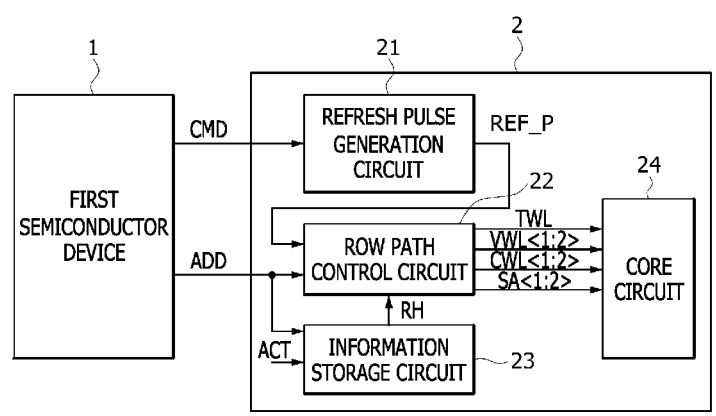
FIG. 1 is a block diagram illustrating a representation of an example of the configuration of a semiconductor system in accordance with an embodiment.

Referring to FIG. 1, a semiconductor system in accordance with an embodiment may include a first semiconductor device 1 and a second semiconductor device 2. The second semiconductor device 2 may include a refresh pulse generation circuit 21, a row path control circuit 22, an information storage circuit 23, and a core circuit 24.

The first semiconductor device 1 may apply a command CMD and an address ADD to the second semiconductor device 2. The command CMD and the address ADD may be realized to be transmitted through the same line or to be transmitted through different lines. Each of the command CMD and the address ADD may include a plurality of bits.

The refresh pulse generation circuit 21 may generate a refresh pulse REF_P in response to the command CMD. The refresh pulse generation circuit 21 may generate the refresh pulse REF_P by decoding the command CMD. The refresh pulse REF_P may be generated to perform a refresh operation.

The row path control circuit 22 may drive a target word line TWL, first and second adjacent word lines VWL<1:2>, first and second clone word lines CWL<1:2> and first and second sense amplifier signals SA<1:2> in response to the refresh pulse REF_P, the address ADD and an access information RH. The row path control circuit 22 may drive the target word line TWL by decoding the address ADD. The target word line TWL may be driven to a predetermined logic level according to a logic level combination of the bits included in the address ADD. The logic level combination of the bits included in the address ADD, capable of driving the target word line TWL, may be set in a variety of ways according to embodiments. In the case where the access information RH corresponding to the address ADD is enabled while a refresh operation is performed, the row path control circuit 22 may store the data of the cells coupled to the first and second adjacent word lines VWL<1:2>, in the cells coupled to the first and second clone word lines CWL<1:2>, by the first and second sense amplifier signals SA<1:2>.

The information storage circuit 23 may generate the access information RH in response to the address ADD and an active signal ACT. The active signal ACT may be a signal which is enabled to perform an active operation. The information storage circuit 23 may store an information on the target word line TWL which is driven according to the logic level combination of the address ADD while the active operation is performed. For example, the information storage circuit 23 may generate the access information RH which is enabled in the case where the target word line TWL is driven at least a predetermined number of times. The fact that the active operation is performed for the target word line TWL means that cells coupled to the target word line TWL are accessed.

The core circuit 24 may include a plurality of cells which are coupled to the target word line TWL, the first and second adjacent word lines VWL<1:2> and the first and second clone word lines CWL<1:2>. The cells coupled to the target word line TWL may be accessed in the case where the target word line TWL is driven. The cells coupled to the first and second adjacent word lines VWL<1:2> may be accessed in the case where the first and second adjacent word lines VWL<1:2> are driven. The cells coupled to the first and second clone word lines CWL<1:2> may be accessed in the case where the first and second clone word lines CWL<1:2> are driven. The core circuit 24 may store the data of the cells coupled to the first and second adjacent word lines VWL<1:2>, in the cells coupled to the first and second clone word lines CWL<1:2>, in response to the first and second sense amplifier signals SA<1:2>.

Figure 2:
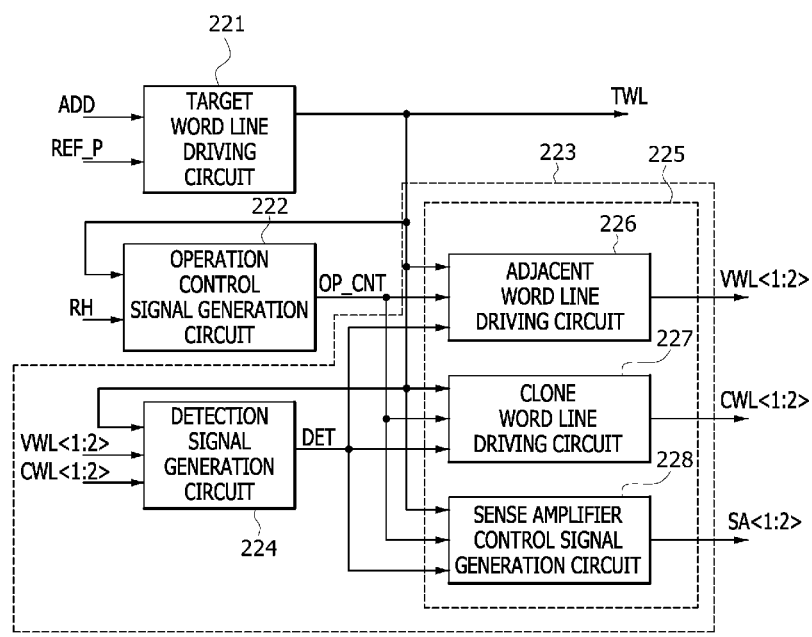
FIG. 2 is a block diagram illustrating a representation of an example of the configuration of the row path control circuit included in the semiconductor system illustrated in FIG. 1.

Referring to FIG. 2, the row path control circuit 22 may include a target word line driving circuit 221, an operation control signal generation circuit 222, and a copy operation circuit 223.

The target word line driving circuit 221 may drive the target word line TWL in response to the address ADD and the refresh pulse REF_P. The target word line driving circuit 221 may drive the target word line TWL by decoding the address ADD. The target word line TWL may be driven to the predetermined logic level according to the logic level combination of the bits included in the address ADD. The logic level combination of the bits included in the address ADD, capable of driving the target word line TWL, may be set in a variety of ways according to embodiments.

The operation control signal generation circuit 222 may generate an operation control signal OP_CNT in response to the target word line TWL and the access information RH. The operation control signal generation circuit 222 may generate the operation control signal OP_CNT for the target word line TWL which is accessed, based on the access information RH. The access information RH may be enabled in the case where the target word line TWL is driven at least the predetermined number of times. The operation control signal OP_CNT may be enabled in the case where the target word line TWL is accessed in the state in which the access information RH is enabled. That is to say, the access information RH is enabled in the case where the target word line TWL is driven at least the predetermined number of times, and the operation control signal OP_CNT is enabled in the case where the target word line TWL is accessed in the state in which the access information RH is enabled.

The copy operation circuit 223 may include a detection signal generation circuit 224 and a row control circuit 225.

The detection signal generation circuit 224 may generate a detection signal DET in response to the target word line TWL, the first and second adjacent word lines VWL<1:2> and the first and second clone word lines CWL<1:2>. The detection signal generation circuit 224 may generate the detection signal DET which is enabled in the case where the data of the cells coupled to the first and second adjacent word lines VWL<1:2> adjacent to the target word line TWL and the data of the cells coupled to the first and second clone word lines CWL<1:2> are the same. In the case where a copy operation of storing the data of the cells coupled to the first and second adjacent word lines VWL<1:2> in the cells coupled to the first and second clone word lines CWL<1:2> is performed, the data of the cells coupled to the first and second adjacent word lines VWL<1:2> and the data of the cells coupled to the first and second clone word lines CWL<1:2> may be set to be the same.

The row control circuit 225 may drive the first and second adjacent word lines VWL<1:2> and the first and second clone word lines CWL<1:2> in response to the target word line TWL, the operation control signal OP_CNT and the detection signal DET, and generate the first and second sense amplifier signals SA<1:2>. The row control circuit 225 may perform the copy operation of storing the data of the cells coupled to the first and second adjacent word lines VWL<1:2> in the cells coupled to the first and second clone word lines CWL<1:2>, in the state in which the operation control signal OP_CNT is enabled and the detection signal DET is disabled. The row control circuit 225 may cut off the copy operation of storing the data of the cells coupled to the first and second adjacent word lines VWL<1:2> in the cells coupled to the first and second clone word lines CWL<1:2>, in the state in which the detection signal DET is enabled.

For example, the row control circuit 225 may include an adjacent word line driving circuit 226, a clone word line driving circuit 227, and a sense amplifier control signal generation circuit 228.

The adjacent word line driving circuit 226 may drive the first and second adjacent word lines VWL<1:2> in response to the target word line TWL, the operation control signal OP_CNT and the detection signal DET. The adjacent word line driving circuit 226 may drive the first and second adjacent word lines VWL<1:2> adjacent to the target word line TWL, in the state in which the operation control signal OP_CNT is enabled and the detection signal DET is disabled. The adjacent word line driving circuit 226 may interrupt the driving of the first and second adjacent word lines VWL<1:2>, in the state in which the detection signal DET is enabled.

The clone word line driving circuit 227 may drive the first and second clone word lines CWL<1:2> in response to the target word line TWL, the operation control signal OP_CNT and the detection signal DET. The clone word line driving circuit 227 may drive the first and second clone word lines CWL<1:2>, in the state in which the operation control signal OP_CNT is enabled and the detection signal DET is disabled. The first and second clone word lines CWL<1:2> may be set to be included in the same cell region as or a different cell region from the first and second adjacent word lines VWL<1:2>. The clone word line driving circuit 227 may interrupt the driving of the first and second clone word lines CWL<1:2>, in the state in which the detection signal DET is enabled.

The sense amplifier control signal generation circuit 228 may generate the first and second sense amplifier signals SA<1:2> in response to the target word line TWL, the operation control signal OP_CNT and the detection signal DET. The sense amplifier control signal generation circuit 228 may generate the first and second sense amplifier signals SA<1:2> which are enabled, in the state in which the operation control signal OP_CNT is enabled and the detection signal DET is disabled. The sense amplifier control signal generation circuit 228 may generate the first and second sense amplifier signals SA<1:2> which are disabled, in the state in which the detection signal DET is enabled.

Figure 3:
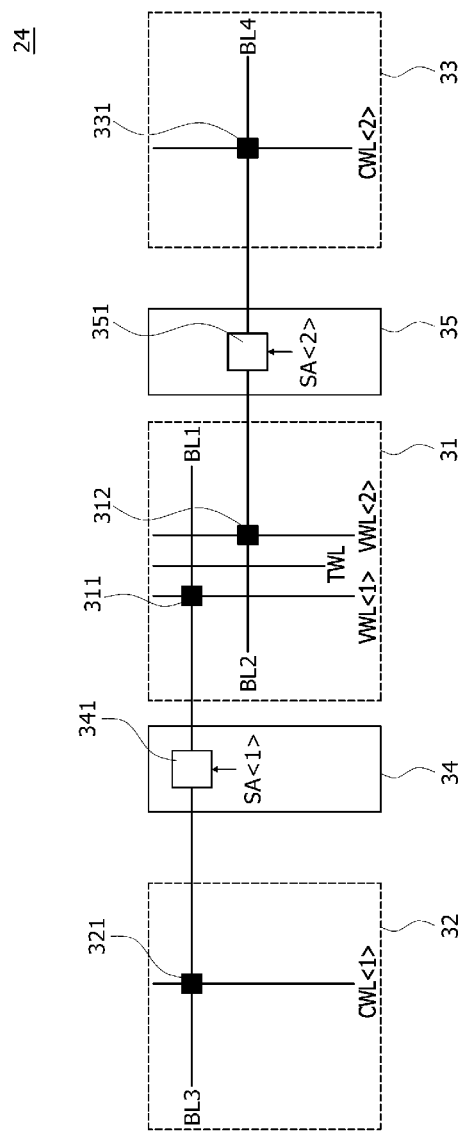
FIG. 3 is a block diagram illustrating a representation of an example of the configuration of the core circuit included in the semiconductor system illustrated in FIG. 1.

Referring to FIG. 3, the core circuit 24 may include a first cell region 31, a second cell region 32, a third cell region 33, a first sense amplifier region 34, and a second sense amplifier region 35.

The first cell region 31 may include a first cell 311 and a second cell 312. The first cell 311 may be coupled between the first adjacent word line VWL<1> and a first bit line BL1. The first cell 311 may be accessed when the first adjacent word line VWL<1> is driven. In the case where the first cell 311 is accessed, the data stored in the first cell 311 may be transferred to the first bit line BL1. The second cell 312 may be coupled between the second adjacent word line VWL<2> and a second bit line BL2. The second cell 312 may be accessed when the second adjacent word line VWL<2> is driven. In the case where the second cell 312 is accessed, the data stored in the second cell 312 may be transferred to the second bit line BL2.

The second cell region 32 may include a third cell 321. The third cell 321 may be coupled between the first clone word line CWL<1> and a third bit line BL3. The third cell 321 may be accessed when the first clone word line CWL<1> is driven. In the case where the third cell 321 is accessed, the data of the third bit line BL3 may be stored in the third cell 321.

The third cell region 33 may include a fourth cell 331. The fourth cell 331 may be coupled between the second clone word line CWL<2> and a fourth bit line BL4. The fourth cell 331 may be accessed when the second clone word line CWL<2> is driven. In the case where the fourth cell 331 is accessed, the data of the fourth bit line BL4 may be stored in the fourth cell 331.

The first sense amplifier region 34 may include a first sense amplifier 341 which operates in response to the first sense amplifier signal SA<1>. The first sense amplifier 341 may be coupled between the first bit line BL1 and the third bit line BL3, and sense and amplify the data loaded on the first bit line BL1 and the third bit line BL3, in the case where the first sense amplifier signal SA<1> is enabled. By the sensing and amplification operation of the first sense amplifier 341, the data loaded on the first bit line BL1 and the third bit line BL3 are driven to logic levels inverted with each other. Therefore, the data of the first cell 311 coupled to the first bit line BL1 may be sensed and amplified to an inverted logic level by the first sense amplifier 341, and be stored in the third cell 321 through the third bit line BL3.

The second sense amplifier region 35 may include a second sense amplifier 351 which operates in response to the second sense amplifier signal SA<2>. The second sense amplifier 351 may be coupled between the second bit line BL2 and the fourth bit line BL4, and sense and amplify the data loaded on the second bit line BL2 and the fourth bit line BL4, in the case where the second sense amplifier signal SA<2> is enabled. By the sensing and amplification operation of the second sense amplifier 351, the data loaded on the second bit line BL2 and the fourth bit line BL4 are driven to logic levels inverted with each other. Therefore, the data of the second cell 312 coupled to the second bit line BL2 may be sensed and amplified to an inverted logic level by the second sense amplifier 351, and be stored in the fourth cell 331 through the fourth bit line BL4.

Figure 4:
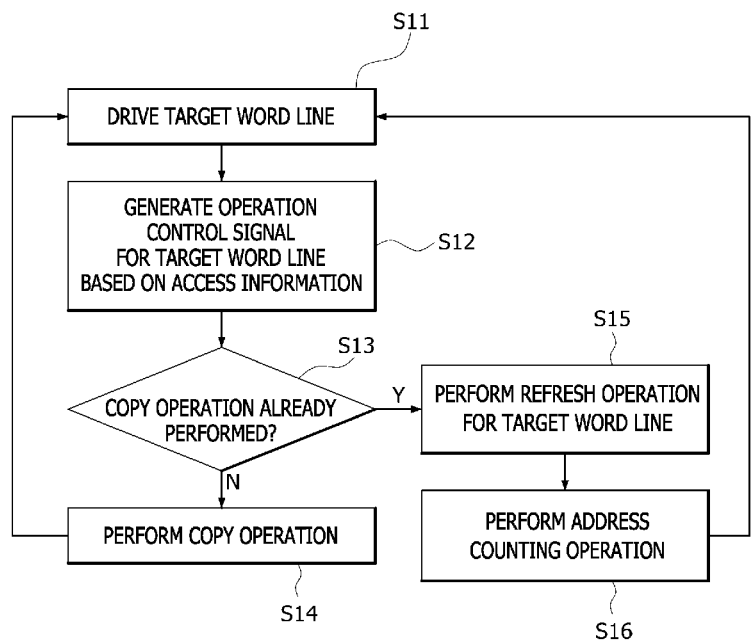
FIG. 4 is a representation of an example of a flow chart to assist in the explanation of the operation of the semiconductor system illustrated in FIG. 1.

An operation of a semiconductor system configured as mentioned above will be described below with reference to FIG. 4 on the assumption, for example, that refresh operations for all cells included in the second semiconductor device 2 are sequentially performed.

If a target word line corresponding to an address having a first logic level combination is driven (S11), an operation control signal which is enabled to perform a copy operation for the target word line, based on an access information, is generated (S12). In other words, in the case where the target word line is driven in the state in which the access information is enabled as the target word line is driven at least a predetermined number of times, the operation control signal which is enabled is generated. In the case where the operation control signal is enabled, whether a copy operation has already been performed is determined (S13).

In the state in which the copy operation has not been performed for the target word line corresponding to the address having the first logic level combination, the copy operation of storing the data of the memory cells coupled to adjacent word lines adjacent to the target word line, in the memory cells coupled to clone word lines, is performed (S14). After the copy operation is performed, the operation of driving the target word line corresponding to the address having the first logic level combination is iterated (S11).

In the state in which the copy operation for the target word line corresponding to the address having the first logic level combination has already been performed, a refresh operation for the target word line is performed (S15), and then, an address counting operation is performed to drive a next target word line (S16). By the address counting operation, a target word line corresponding to an address having a second logic level combination is driven.

In a semiconductor system according to an embodiment, since the data of the cells coupled to adjacent word lines adjacent to a target word line which is accessed concentratedly are stored in the cells coupled to clone word lines, it may be possible to prevent the data of the adjacent word lines from being lost. Also, in the semiconductor system according to an embodiment, since an additional refresh operation is not performed for the adjacent word lines adjacent to the target word line which is accessed concentratedly and only a copy operation is performed, a refresh operation count may be decreased to a minimum, whereby the performance of a semiconductor device may be improved and consumption of refresh power may be reduced. In the semiconductor system according to an embodiment, after performing the copy operation of storing the data of the cells coupled to the adjacent word lines adjacent to the target word line which is accessed concentratedly, in the cells coupled to the clone word lines, in the case where the target word line is accessed again, a refresh operation for only the target word line is performed, a copy operation is not performed iteratively, and refresh operations for the adjacent word lines are not performed, whereby power consumption may be reduced.

Figure 5:
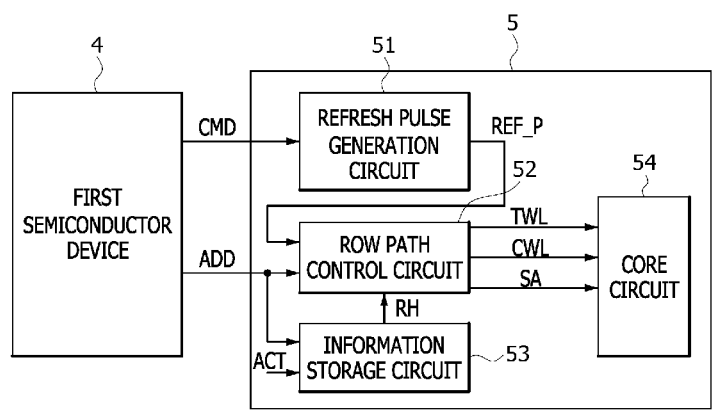
FIG. 5 is a block diagram illustrating a representation of an example of the configuration of a semiconductor system in accordance with an embodiment.

Referring to FIG. 5, a semiconductor system in accordance with an embodiment may include a first semiconductor device 4 and a second semiconductor device 5. The second semiconductor device 5 may include a refresh pulse generation circuit 51, a row path control circuit 52, an information storage circuit 53, and a core circuit 54.

The first semiconductor device 4 may apply a command CMD and an address ADD to the second semiconductor device 5. The command CMD and the address ADD may be realized to be transmitted through the same line or to be transmitted through different lines. Each of the command CMD and the address ADD may include a plurality of bits.

The refresh pulse generation circuit 51 may generate a refresh pulse REF_P in response to the command CMD. The refresh pulse generation circuit 51 may generate the refresh pulse REF_P by decoding the command CMD. The refresh pulse REF_P may be generated to perform a refresh operation.

The row path control circuit 52 may drive a target word line TWL, a clone word line CWL and a sense amplifier signal SA in response to the refresh pulse REF_P, the address ADD and an access information RH. The row path control circuit 52 may drive the target word line TWL by decoding the address ADD. The target word line TWL may be driven to a predetermined logic level according to a logic level combination of the bits included in the address ADD. The logic level combination of the bits included in the address ADD, capable of driving the target word line TWL, may be set in a variety of ways according to embodiments. In the case where the access information RH corresponding to the address ADD is enabled while a refresh operation is performed, the row path control circuit 52 may store the data of the cells coupled to the target word line TWL, in the cells coupled to the clone word line CWL, by the sense amplifier signal SA.

The information storage circuit 53 may generate the access information RH in response to the address ADD and an active signal ACT. The active signal ACT may be a signal which is enabled to perform an active operation. The information storage circuit 53 may store information on the target word line TWL which is driven according to the logic level combination of the address ADD while the active operation is performed. For example, the information storage circuit 53 may generate the access information RH which is enabled in the case where the target word line TWL is driven at least a predetermined number of times. The fact that the active operation is performed for the target word line TWL means that cells coupled to the target word line TWL are accessed.

The core circuit 54 may include a plurality of cells which are coupled to the target word line TWL and the clone word line CWL. The cells coupled to the target word line TWL may be accessed in the case where the target word line TWL is driven. The cells coupled to the clone word line CWL may be accessed in the case where the clone word line CWL is driven. The core circuit 54 may store the data of the cells coupled to the target word line TWL, in the cells coupled to the clone word line CWL, in response to the sense amplifier signal SA.

Figure 6:
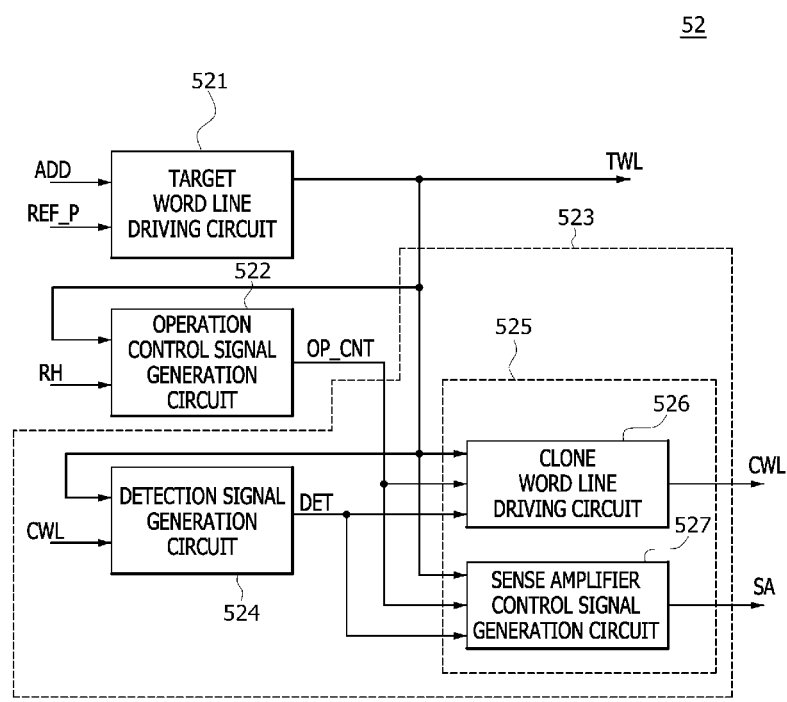
FIG. 6 is a block diagram illustrating a representation of an example of the configuration of the row path control circuit included in the semiconductor system illustrated in FIG. 5.

Referring to FIG. 6, the row path control circuit 52 may include a target word line driving circuit 521, an operation control signal generation circuit 522, and a copy operation circuit 523.

The target word line driving circuit 521 may drive the target word line TWL in response to the address ADD and the refresh pulse REF_P. The target word line driving circuit 521 may drive the target word line TWL by decoding the address ADD. The target word line TWL may be driven to the predetermined logic level according to the logic level combination of the bits included in the address ADD. The logic level combination of the bits included in the address ADD, capable of driving the target word line TWL, may be set in a variety of ways according to embodiments.

The operation control signal generation circuit 522 may generate an operation control signal OP_CNT in response to the target word line TWL and the access information RH. The operation control signal generation circuit 522 may generate the operation control signal OP_CNT for the target word line TWL which is accessed, based on the access information RH. The access information RH may be enabled in the case where the target word line TWL is driven at least the predetermined number of times. The operation control signal OP_CNT may be enabled in the case where the target word line TWL is accessed in the state in which the access information RH is enabled. That is to say, the access information RH is enabled in the case where the target word line TWL is driven at least the predetermined number of times, and the operation control signal OP_CNT is enabled in the case where the target word line TWL is accessed in the state in which the access information RH is enabled.

The copy operation circuit 523 may include a detection signal generation circuit 524 and a row control circuit 525.

The detection signal generation circuit 524 may generate a detection signal DET in response to the target word line TWL and the clone word line CWL. The detection signal generation circuit 524 may generate the detection signal DET which is enabled in the case where the data of the cells coupled to the target word line TWL and the data of the cells coupled to the clone word line CWL are the same. In the case where a copy operation of storing the data of the cells coupled to the target word line TWL in the cells coupled to the clone word line CWL is performed, the data of the cells coupled to the target word line TWL and the data of the cells coupled to the clone word line CWL may be set to be the same.

The row control circuit 525 may drive the clone word line CWL in response to the target word line TWL, the operation control signal OP_CNT and the detection signal DET, and generate the sense amplifier signal SA. The row control circuit 525 may perform the copy operation of storing the data of the cells coupled to the target word line TWL in the cells coupled to the clone word line CWL, in the state in which the operation control signal OP_CNT is enabled and the detection signal DET is disabled. The row control circuit 525 may cut off the copy operation of storing the data of the cells coupled to the target word line TWL in the cells coupled to the clone word line CWL, in the state in which the detection signal DET is enabled.

For example, the row control circuit 525 may include a clone word line driving circuit 526 and a sense amplifier control signal generation circuit 527.

The clone word line driving circuit 526 may drive the clone word line CWL in response to the target word line TWL, the operation control signal OP_CNT and the detection signal DET. The clone word line driving circuit 526 may drive the clone word line CWL in the state in which the operation control signal OP_CNT is enabled and the detection signal DET is disabled. The clone word line CWL may be set to be included in the same cell region as or a different cell region from the target word line TWL. The clone word line driving circuit 526 may interrupt the driving of the clone word line CWL in the state in which the detection signal DET is enabled.

The sense amplifier control signal generation circuit 527 may generate the sense amplifier signal SA in response to the target word line TWL, the operation control signal OP_CNT and the detection signal DET. The sense amplifier control signal generation circuit 527 may generate the sense amplifier signal SA which is enabled, in the state in which the operation control signal OP_CNT is enabled and the detection signal DET is disabled. The sense amplifier control signal generation circuit 527 may generate the sense amplifier signal SA which is disabled, in the state in which the detection signal DET is enabled.

Figure 7:
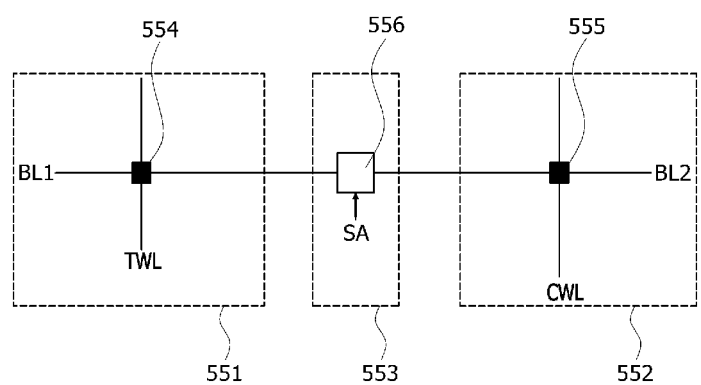
FIG. 7 is a block diagram illustrating a representation of an example of the configuration of the core circuit included in the semiconductor system illustrated in FIG. 5.

Referring to FIG. 7, the core circuit 54 may include a first cell region 551, a second cell region 552 and a sense amplifier region 553.

The first cell region 551 may include a first cell 554. The first cell 554 may be coupled between the target word line TWL and a first bit line BL1. The first cell 554 may be accessed when the target word line TWL is driven. In the case where the first cell 554 is accessed, the data stored in the first cell 554 may be transferred to the first bit line BL1.

The second cell region 552 may include a second cell 555. The second cell 555 may be coupled between the clone word line CWL and a second bit line BL2. The second cell 555 may be accessed when the clone word line CWL is driven. In the case where the second cell 555 is accessed, the data of the second bit line BL2 may be stored in the second cell 555.

The sense amplifier region 553 may include a sense amplifier 556 which operates in response to the sense amplifier signal SA. The sense amplifier 556 may be coupled between the first bit line BL1 and the second bit line BL2, and sense and amplify the data loaded on the first bit line BL1 and the second bit line BL2, in the case where the sense amplifier signal SA is enabled. By the sensing and amplification operation of the sense amplifier 556, the data loaded on the first bit line BL1 and the second bit line BL2 are driven to logic levels inverted with each other. Therefore, the data of the first cell 554 coupled to the first bit line BL1 may be sensed and amplified to an inverted logic level by the sense amplifier 556, and be stored in the second cell 555 through the second bit line BL2.

In a semiconductor system according to an embodiment, since the data of the cells coupled to a target word line which is accessed concentratedly are stored in the cells coupled to a clone word line, it may be possible to prevent the data of the target word line from being lost. In a semiconductor system according to an embodiment, after performing the copy operation of storing the data of the cells coupled to the target word line which is accessed concentratedly, in the cells coupled to the clone word line, in the case where the target word line is accessed again, a refresh operation for only the target word line is performed and a copy operation is not performed iteratively, whereby power consumption may be reduced.

Figure 8:
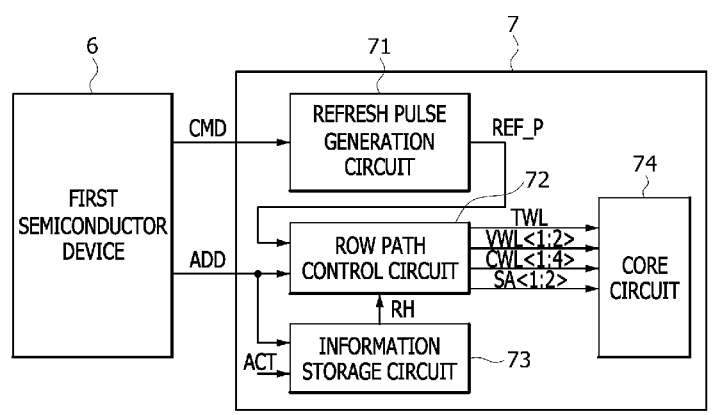
FIG. 8 is a block diagram illustrating a representation of an example of the configuration of a semiconductor system in accordance with an embodiment.

Referring to FIG. 8, a semiconductor system in accordance with an embodiment may include a first semiconductor device 6 and a second semiconductor device 7. The second semiconductor device 7 may include a refresh pulse generation circuit 71, a row path control circuit 72, an information storage circuit 73, and a core circuit 74.

The first semiconductor device 6 may apply a command CMD and an address ADD to the second semiconductor device 7. The command CMD and the address ADD may be realized to be transmitted through the same line or to be transmitted through different lines. Each of the command CMD and the address ADD may include a plurality of bits.

The refresh pulse generation circuit 71 may generate a refresh pulse REF_P in response to the command CMD. The refresh pulse generation circuit 71 may generate the refresh pulse REF_P by decoding the command CMD. The refresh pulse REF_P may be generated to perform a refresh operation.

The row path control circuit 72 may drive a target word line TWL, first and second adjacent word lines VWL<1:2>, first to fourth clone word lines CWL<1:4> and first and second sense amplifier signals SA<1:2> in response to the refresh pulse REF_P, the address ADD and an access information RH. The row path control circuit 72 may drive the target word line TWL by decoding the address ADD. The target word line TWL may be driven to a predetermined logic level according to a logic level combination of the bits included in the address ADD. The logic level combination of the bits included in the address ADD, capable of driving the target word line TWL, may be set in a variety of ways according to embodiments. In the case where the access information RH corresponding to the address ADD is enabled while a refresh operation is performed, the row path control circuit 72 may perform a first copy operation of storing the data of the cells coupled to the first and second adjacent word lines VWL<1:2>, in the cells coupled to the first and second clone word lines CWL<1:2>, by the first and second sense amplifier signals SA<1:2>. After performing the first copy operation, the row path control circuit 72 may perform a second copy operation of storing the data of the cells coupled to the first and second clone word lines CWL<1:2>, in the cells coupled to the third and fourth clone word lines CWL<3:4>, by the first and second sense amplifier signals SA<1:2>.

The information storage circuit 73 may generate the access information RH in response to the address ADD and an active signal ACT. The active signal ACT may be a signal which is enabled to perform an active operation. The information storage circuit 73 may store information on the target word line TWL which is driven according to the logic level combination of the address ADD while the active operation is performed. For example, the information storage circuit 73 may generate the access information RH which is enabled in the case where the target word line TWL is driven at least a predetermined number of times. The fact that the active operation is performed for the target word line TWL means that cells coupled to the target word line TWL are accessed.

The core circuit 74 may include a plurality of cells which are coupled to the target word line TWL, the first and second adjacent word lines VWL<1:2> and the first to fourth clone word lines CWL<1:4>. The cells coupled to the target word line TWL may be accessed in the case where the target word line TWL is driven. The cells coupled to the first and second adjacent word lines VWL<1:2> may be accessed in the case where the first and second adjacent word lines VWL<1:2> are driven. The cells coupled to the first to fourth clone word lines CWL<1:4> may be accessed in the case where the first to fourth clone word lines CWL<1:4> are driven. The core circuit 74 may perform the first copy operation of storing the data of the cells coupled to the first and second adjacent word lines VWL<1:2>, in the cells coupled to the first and second clone word lines CWL<1:2>, in response to the first and second sense amplifier signals SA<1:2>. After performing the first copy operation, the core circuit 74 may perform the second copy operation of storing the data of the cells coupled to the first and second clone word lines CWL<1:2>, in the cells coupled to the third and fourth clone word lines CWL<3:4>, by the first and second sense amplifier signals SA<1:2>.

Figure 9:
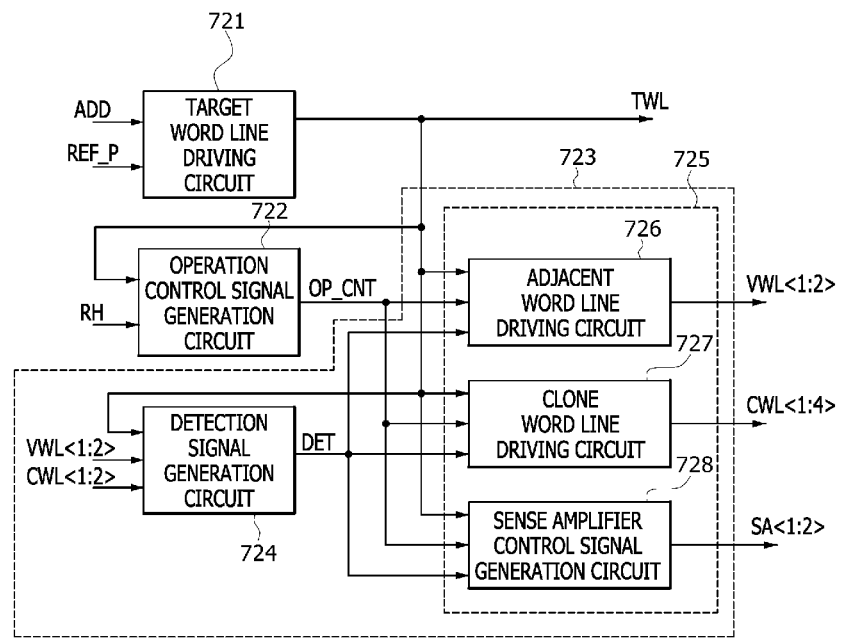
FIG. 9 is a block diagram illustrating a representation of an example of the configuration of the row path control circuit included in the semiconductor system illustrated in FIG. 8.

Referring to FIG. 9, the row path control circuit 72 may include a target word line driving circuit 721, an operation control signal generation circuit 722, and a copy operation circuit 723.

The target word line driving circuit 721 may drive the target word line TWL in response to the address ADD and the refresh pulse REF_P. The target word line driving circuit 721 may drive the target word line TWL by decoding the address ADD. The target word line TWL may be driven to the predetermined logic level according to the logic level combination of the bits included in the address ADD. The logic level combination of the bits included in the address ADD, capable of driving the target word line TWL, may be set in a variety of ways according to embodiments.

The operation control signal generation circuit 722 may generate an operation control signal OP_CNT in response to the target word line TWL and the access information RH. The operation control signal generation circuit 722 may generate the operation control signal OP_CNT for the target word line TWL which is accessed, based on the access information RH. The access information RH may be enabled in the case where the target word line TWL is driven at least the predetermined number of times. The operation control signal OP_CNT may be enabled in the case where the target word line TWL is accessed in the state in which the access information RH is enabled. That is to say, the access information RH is enabled in the case where the target word line TWL is driven at least the predetermined number of times, and the operation control signal OP_CNT is enabled in the case where the target word line TWL is accessed in the state in which the access information RH is enabled.

The copy operation circuit 723 may include a detection signal generation circuit 724 and a row control circuit 725.

The detection signal generation circuit 724 may generate a detection signal DET in response to the target word line TWL, the first and second adjacent word lines VWL<1:2> and the first and second clone word lines CWL<1:2>. The detection signal generation circuit 724 may generate the detection signal DET which is enabled in the case where the data of the cells coupled to the first and second adjacent word lines VWL<1:2> adjacent to the target word line TWL and the data of the cells coupled to the first and second clone word lines CWL<1:2> are the same. In the case where the first copy operation of storing the data of the cells coupled to the first and second adjacent word lines VWL<1:2> in the cells coupled to the first and second clone word lines CWL<1:2> is performed, the data of the cells coupled to the first and second adjacent word lines VWL<1:2> and the data of the cells coupled to the first and second clone word lines CWL<1:2> may be set to be the same.

The row control circuit 725 may drive the first and second adjacent word lines VWL<1:2> and the first to fourth clone word lines CWL<1:4> in response to the target word line TWL, the operation control signal OP_CNT and the detection signal DET, and generate the first and second sense amplifier signals SA<1:2>. The row control circuit 725 may perform the first copy operation of storing the data of the cells coupled to the first and second adjacent word lines VWL<1:2> in the cells coupled to the first and second clone word lines CWL<1:2>, in the state in which the operation control signal OP_CNT is enabled and the detection signal DET is disabled. After performing the first copy operation, the row control circuit 725 may perform the second copy operation of storing the data of the cells coupled to the first and second clone word lines CWL<1:2>, in the cells coupled to the third and fourth clone word lines CWL<3:4>. The row control circuit 725 may cut off the first copy operation of storing the data of the cells coupled to the first and second adjacent word lines VWL<1:2> in the cells coupled to the first and second clone word lines CWL<1:2>, in the state in which the detection signal DET is enabled.

For example, the row control circuit 725 may include an adjacent word line driving circuit 726, a clone word line driving circuit 727, and a sense amplifier control signal generation circuit 728.

The adjacent word line driving circuit 726 may drive the first and second adjacent word lines VWL<1:2> in response to the target word line TWL, the operation control signal OP_CNT and the detection signal DET. The adjacent word line driving circuit 726 may drive the first and second adjacent word lines VWL<1:2> adjacent to the target word line TWL, in the state in which the operation control signal OP_CNT is enabled and the detection signal DET is disabled. The adjacent word line driving circuit 726 may interrupt the driving of the first and second adjacent word lines VWL<1:2>, in the state in which the detection signal DET is enabled.

The clone word line driving circuit 727 may drive the first to fourth clone word lines CWL<1:4> in response to the target word line TWL, the operation control signal OP_CNT and the detection signal DET. The clone word line driving circuit 727 may drive the first to fourth clone word lines CWL<1:4>, in the state in which the operation control signal OP_CNT is enabled and the detection signal DET is disabled. The first to fourth clone word lines CWL<1:4> may be set to be included in the same cell region as or a different cell region from the first and second adjacent word lines VWL<1:2>. The clone word line driving circuit 727 may interrupt the driving of the first to fourth clone word lines CWL<1:4>, in the state in which the detection signal DET is enabled.

The sense amplifier control signal generation circuit 728 may generate the first and second sense amplifier signals SA<1:2> in response to the target word line TWL, the operation control signal OP_CNT and the detection signal DET. The sense amplifier control signal generation circuit 728 may generate the first and second sense amplifier signals SA<1:2> which are enabled, in the state in which the operation control signal OP_CNT is enabled and the detection signal DET is disabled. The sense amplifier control signal generation circuit 728 may generate the first and second sense amplifier signals SA<1:2> which are disabled, in the state in which the detection signal DET is enabled.

Figure 10:
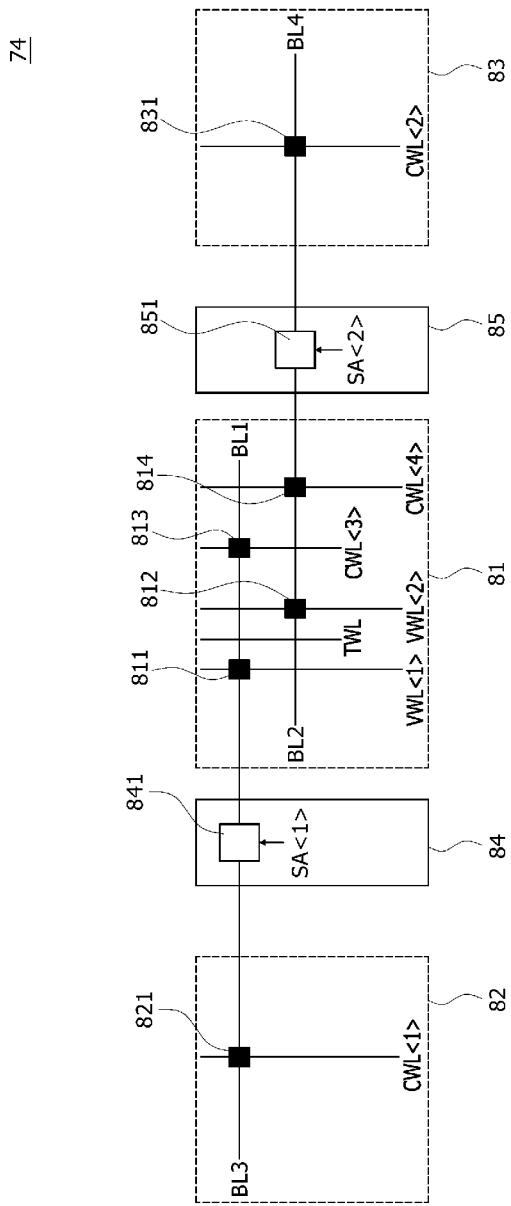
FIG. 10 is a block diagram illustrating a representation of an example of the configuration of the core circuit included in the semiconductor system illustrated in FIG. 8.

Referring to FIG. 10, the core circuit 74 may include a first cell region 81, a second cell region 82, a third cell region 83, a first sense amplifier region 84, and a second sense amplifier region 85.

The first cell region 81 may include a first cell 811, a second cell 812, a third cell 813 and a fourth cell 814. The first cell 811 may be coupled between the first adjacent word line VWL<1> and a first bit line BL1. The first cell 811 may be accessed when the first adjacent word line VWL<1> is driven. In the case where the first cell 811 is accessed, the data stored in the first cell 811 may be transferred to the first bit line BL1. The second cell 812 may be coupled between the second adjacent word line VWL<2> and a second bit line BL2. The second cell 812 may be accessed when the second adjacent word line VWL<2> is driven. In the case where the second cell 812 is accessed, the data stored in the second cell 812 may be transferred to the second bit line BL2. The third cell 813 may be coupled between the third clone word line CWL<3> and the first bit line BL1. The third cell 813 may be accessed when the third clone word line CWL<3> is driven. In the case where the third cell 813 is accessed, the data stored in the third cell 813 may be transferred to the first bit line BL1. The fourth cell 814 may be coupled between the fourth clone word line CWL<4> and the second bit line BL2. The fourth cell 814 may be accessed when the fourth clone word line CWL<4> is driven. In the case where the fourth cell 814 is accessed, the data stored in the fourth cell 814 may be transferred to the second bit line BL2.

The second cell region 82 may include a fifth cell 821. The fifth cell 821 may be coupled between the first clone word line CWL<1> and a third bit line BL3. The fifth cell 821 may be accessed when the first clone word line CWL<1> is driven. In the case where the fifth cell 821 is accessed, the data of the second bit line BL2 may be stored in the fifth cell 821.

The third cell region 83 may include a sixth cell 831. The sixth cell 831 may be coupled between the second clone word line CWL<2> and a fourth bit line BL4. The sixth cell 831 may be accessed when the second clone word line CWL<2> is driven. In the case where the sixth cell 831 is accessed, the data of the fourth bit line BL4 may be stored in the sixth cell 831.

The first sense amplifier region 84 may include a first sense amplifier 841 which operates in response to the first sense amplifier signal SA<1>. The first sense amplifier 841 may be coupled between the first bit line BL1 and the third bit line BL3, and sense and amplify the data loaded on the first bit line BL1 and the third bit line BL3, in the case where the first sense amplifier signal SA<1> is enabled. By the sensing and amplification operation of the first sense amplifier 841, the data loaded on the first bit line BL1 and the third bit line BL3 are driven to logic levels inverted with each other. Therefore, the data of the first cell 811 coupled to the first bit line BL1 may be sensed and amplified to an inverted logic level by the first sense amplifier 841, and be stored in the fifth cell 821 through the third bit line BL3. Also, the data of the fifth cell 821 coupled to the third bit line BL3 may be sensed and amplified to an inverted logic level by the first sense amplifier 841, and be stored in the third cell 813 through the first bit line BL1.

The second sense amplifier region 85 may include a second sense amplifier 851 which operates in response to the second sense amplifier signal SA<2>. The second sense amplifier 851 may be coupled between the second bit line BL2 and the fourth bit line BL4, and sense and amplify the data loaded on the second bit line BL2 and the fourth bit line BL4, in the case where the second sense amplifier signal SA<2> is enabled. By the sensing and amplification operation of the second sense amplifier 851, the data loaded on the second bit line BL2 and the fourth bit line BL4 are driven to logic levels inverted with each other. Therefore, the data of the second cell 812 coupled to the second bit line BL2 may be sensed and amplified to an inverted logic level by the second sense amplifier 851, and be stored in the sixth cell 831 through the fourth bit line BL4. Also, the data of the sixth cell 831 coupled to the fourth bit line BL4 may be sensed and amplified to an inverted logic level by the second sense amplifier 851, and be stored in the fourth cell 814 through the second bit line BL2.

In a semiconductor system according to an embodiment, since the data of the cells coupled to adjacent word lines adjacent to a target word line which is accessed concentratedly are stored in the cells coupled to clone word lines, it may be possible to prevent the data of the adjacent word lines from being lost. Also, in a semiconductor system according to an embodiment, since an additional refresh operation is not performed for the adjacent word lines adjacent to the target word line which is accessed concentratedly and only a copy operation is performed, a refresh operation count may be decreased to a minimum, whereby the performance of a semiconductor device may be improved and consumption of refresh power may be reduced. In a semiconductor system according to an embodiment, after performing the copy operation of storing the data of the cells coupled to the adjacent word lines adjacent to the target word line which is accessed concentratedly, in the cells coupled to the clone word lines, in the case where the target word line is accessed again, a refresh operation for only the target word line is performed, a copy operation is not performed iteratively, and refresh operations for the adjacent word lines are not performed, whereby power consumption may be reduced.

Figure 11:
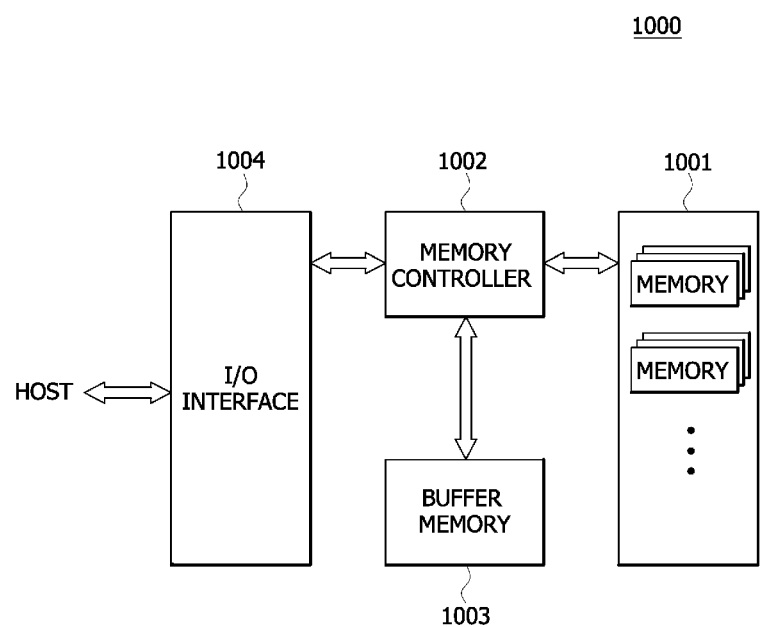
FIG. 11 is a diagram illustrating a representation of an example of the configuration of an electronic system to which the semiconductor systems illustrated in FIGS. 1 to 10 may be applied.

The semiconductor devices described above with reference to FIGS. 1 to 10 may be applied to an electronic system which includes a memory system, a graphic system, a computing system or a mobile system. For example, referring to FIG. 11, an electronic system 1000 in accordance with an embodiment may include a data storage 1001, a memory controller 1002, a buffer memory 1003, and an input/output interface 1004.

The data storage 1001 stores data applied from the memory controller 1002, and reads out stored data and outputs the read-out data to the memory controller 1002, according to control signals from the memory controller 1002. The data storage 1001 may include the second semiconductor device 2 illustrated in FIG. 1, the second semiconductor device 5 illustrated in FIG. 5, or the second semiconductor device 7 illustrated in FIG. 8. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. While the memory controller 1002 is illustrated as one block in FIG. 11, a controller for controlling the data storage 1001 and a controller for controlling the buffer memory 1003 as a volatile memory may be independently configured in the memory controller 1002.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the semiconductor device and the semiconductor system described herein should not be limited based on the described embodiments.

What is claimed is:

1. A semiconductor device comprising:
    an operation control signal generation circuit configured for generating an operation control signal for a target word line which is accessed, based on access information; and
    a copy operation circuit configured for performing a first copy operation of storing data of first cells coupled to an adjacent word line adjacent to the target word line, in second cells coupled to a first clone word line, based on the operation control signal and a detection signal, wherein the detection signal is enabled based on the data of the first cells and data of the second cells being the same with each other.

2. The semiconductor device according to claim 1, wherein the access information is enabled based on accessing the target word line at least a predetermined number of times.

3. The semiconductor device according to claim 2, wherein the operation control signal is enabled based on accessing the target word line in a state in which the access information is enabled.

4. The semiconductor device according to claim 1, wherein the copy operation circuit controls the first copy operation based on the detection signal.

5. The semiconductor device according to claim 4, wherein the copy operation circuit cuts off the first copy operation based on the enablement of the detection signal.

6. The semiconductor device according to claim 1, wherein the copy operation circuit comprises a row control circuit configured for driving the adjacent word line and the first clone word line based on the operation control signal and the detection signal and generating a sense amplifier signal for operating a sense amplifier coupled between the adjacent word line and the first clone word line.

7. The semiconductor device according to claim 6, wherein the row control circuit drives the adjacent word line and the first clone word line and enables the sense amplifier signal, for the first copy operation, based on the enablement of the operation control signal and the disablement of the detection signal.

8. The semiconductor device according to claim 6, wherein the row control circuit disables the sense amplifier signal based on the enablement of the detection signal.

9. The semiconductor device according to claim 1, wherein the copy operation circuit performs a second copy operation after performing the first copy operation, and the second copy operation stores data of the second cells coupled to the first clone word line, in third cells coupled to a second clone word line.

10. The semiconductor device according to claim 9, wherein the second clone word line is included in the same cell region as the target word line.

11. The semiconductor device according to claim 9, wherein the second clone word line is included in a different cell region than the first clone word line.

12. A semiconductor device comprising:
an operation control signal generation circuit configured for generating an operation control signal for a target word line which is accessed, based on access information; and
a copy operation circuit configured for performing a copy operation of storing data of first cells coupled to the target word line, in second cells coupled to a clone word line, based on the operation control signal and a detection signal, wherein the detection signal is enabled based on the data of the first cells and data of the second cells being the same with each other.

13. The semiconductor device according to claim 12, wherein the access information is enabled based on accessing the target word line at least a predetermined number of times.

14. The semiconductor device according to claim 13, wherein the operation control signal is enabled based on accessing the target word line in a state in which the access information is enabled.

15. The semiconductor device according to claim 13, wherein the copy operation circuit prevents the copy operation based on the enablement of the detection signal.

16. The semiconductor device according to claim 12, wherein the copy operation circuit comprises a row control circuit configured for driving the clone word line based on the operation control signal and the detection signal, and generating a sense amplifier signal for operating a sense amplifier coupled between the target word line and the clone word line.

17. The semiconductor device according to claim 16, wherein the row control circuit drives the clone word line and enables the sense amplifier signal, for the copy operation, based on the enablement of the operation control signal and the disablement of the detection signal.

18. The semiconductor device according to claim 16, wherein the row control circuit disables the sense amplifier signal based on the enablement of the detection signal.

19. The semiconductor device according to claim 12, wherein the clone word line is included in a different cell region than the target word line.

20. A semiconductor system comprising:
a first semiconductor device configured for outputting a command and an address; and
a second semiconductor device configured for performing a first copy operation for a target word line which is driven based on the address, in a state in which a refresh is performed based on the command, the second semiconductor device generating an operation control signal for the target word line which is accessed, based on access information, and performing the first copy operation of storing data of first cells coupled to an adjacent word line adjacent to the target word line, in second cells coupled to a first clone word line, based on the operation control signal and a detection signal, wherein the detection signal is enabled based on the data of the first cells and data of the second cells being the same with each other.

* * * * *